(12) United States Patent
Crivello et al.

(10) Patent No.: US 7,807,230 B2
(45) Date of Patent: Oct. 5, 2010

(54) CURCUMIN AND CURCUMINOID COMPOUNDS, AND USE THEREOF AS PHOTOSENSITIZERS OF ONIUM SALTS

(75) Inventors: James Crivello, Clifton Park, NY (US); Umut Bulut, Izmir (TR)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 11/917,637

(22) PCT Filed: Jun. 16, 2006

(86) PCT No.: PCT/US2006/023606

§ 371 (c)(1),
(2), (4) Date: May 6, 2008

(87) PCT Pub. No.: WO2006/138637

PCT Pub. Date: Dec. 28, 2006

(65) Prior Publication Data

US 2008/0260960 A1  Oct. 23, 2008

Related U.S. Application Data

(60) Provisional application No. 60/691,064, filed on Jun. 16, 2005.

(51) Int. Cl.
*C08F 2/46* (2006.01)
(52) U.S. Cl. .......................... 427/487; 522/30; 522/31; 522/34
(58) Field of Classification Search ................. 427/487; 522/30, 31, 34
See application file for complete search history.

(56) References Cited

U.S. PATENT DOCUMENTS

| 5,861,415 | A | * | 1/1999 | Majeed et al. | ............... 514/321 |
| 6,187,506 | B1 | * | 2/2001 | Ding et al. | ............... 430/271.1 |
| 6,863,701 | B2 | | 3/2005 | Crivello | |
| 2005/0130064 | A1 | | 6/2005 | West et al. | |

OTHER PUBLICATIONS

Crivello J.V., Bulut U.: "Curcumin: A naturally occuring long-wavelength photosensitizer for diaryliodonium salts" Journal of Polymer Science: Part A: Polymer Chemistry, vol. 43, Sep. 23, 2005, pp. 5217-5231, XP002404068.
Shen L., Ji H.F., Zhang H.Y.: Chemical Physics Letters, No. 409, Jun. 8, 2005, pp. 300-303, XP002404067.

* cited by examiner

*Primary Examiner*—Shamim Ahmed
(74) *Attorney, Agent, or Firm*—Heslin Rothenberg Farley & Mesiti P.C.

(57) ABSTRACT

Curcumin and curcuminoid compounds as photosensitizers for onium salt photoinitiators in cationic photopolymerization reactions are presented.

19 Claims, 14 Drawing Sheets

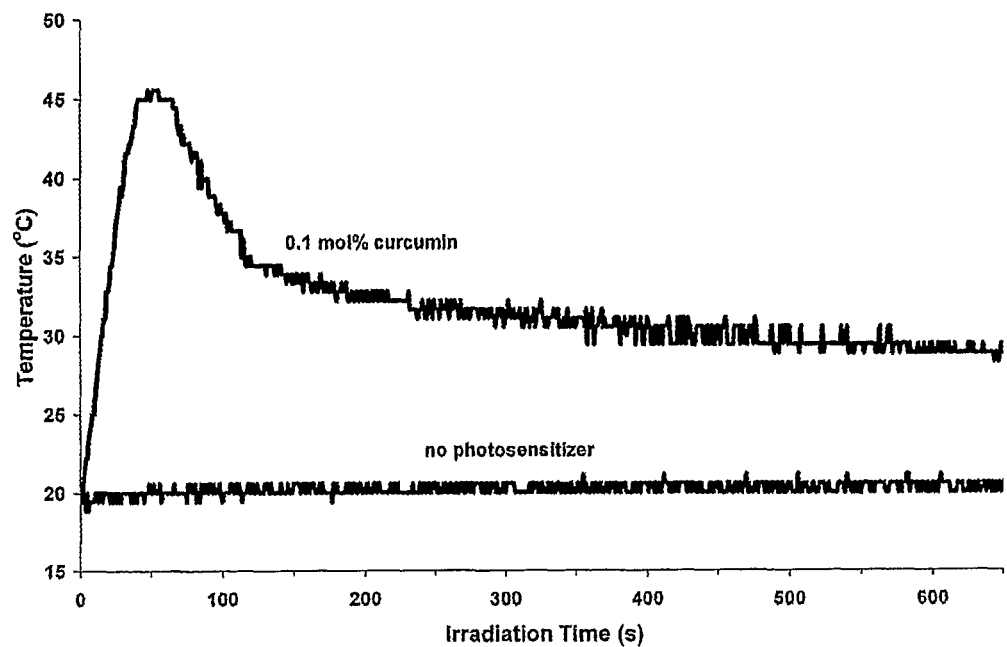
Figure 11.
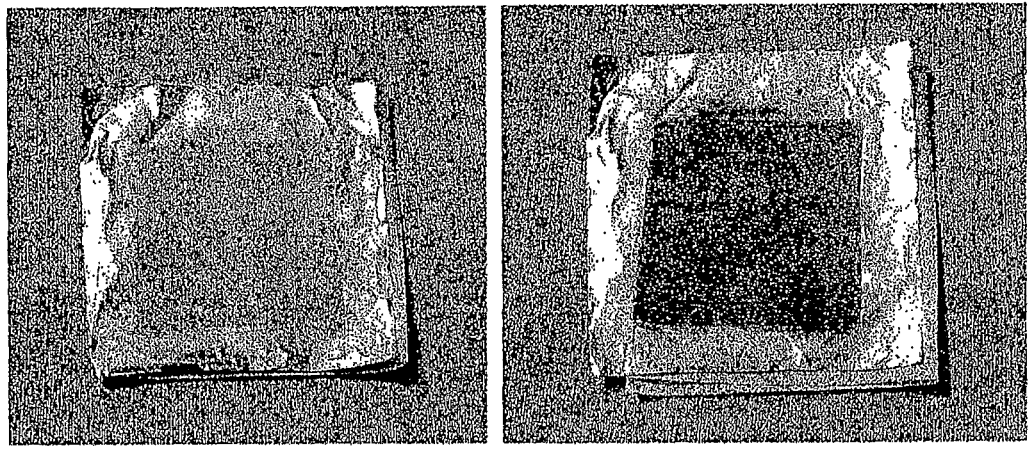
Figure 12. A								Figure 12. B

CURCUMIN AND CURCUMINOID COMPOUNDS, AND USE THEREOF AS PHOTOSENSITIZERS OF ONIUM SALTS

CROSS-REFERENCE TO RELATED APPLICATIONS

This application is a 35 U.S.C. §371 U.S. national stage filing from PCT Application Ser. No. PCT/US2006/023606 having international filing date of Jun. 16, 2006, which claims priority from U.S. Provisional Application Ser. No. 60/691, 064, filed Jun. 16, 2005, both of which are hereby incorporated by reference in their entirety.

FIELD OF THE INVENTION

The invention relates to curcumin and curcuminoid compounds as photo sensitizers for onium salt photoinitiators in cationic photopolymerization reactions.

BACKGROUND OF THE INVENTION

The use of aromatic onium salts such as diaryliodonium and triarylsulfonium salts as photoacid generators in photolithography and as photoinitiators for cationic photopolymerizations in coating, printing ink and adhesive applications is well documented. The ability to conduct both types of these applications using light with a wide range of wavelengths is an especially challenging undertaking. This is particularly the case in the field of imaging science in which a wide variety of light sources with different emission wavelengths are employed. The next generation of microlithographic photoresists will require the use of shorter UV wavelengths (198 and 157 mu) to produce an even smaller and higher density packing of discrete electronic devices. Most onium salts are intrinsically photoactive in the short and middle wavelength region of the UV spectrum and hence, no photosensitizer is required.

Present microelectronic photoimaging applications employ onium salts for deep UV (I-line, 365 nm) photolithography, and since most onium salts do not absorb at this wavelength, photosensitizers are commonly employed. Further, many current and future imaging processes are being designed using light sources such as lasers and light emitting diodes (LEDs) that deliver radiation in the long wavelength UV and visible regions where onium salts are either poorly responsive or completely inactive. Examples of such imaging processes include stereolithography, rapid prepress prototyping, electronic transmission and printing of images, circuit board imaging, patterning of TV screens and LCD displays and photopolymer printing plates.

There are several additional applications such as dental fillings and restoratives that also make use of long wavelength UV-vis (430-490 nM) radiation. One effective method for spectrally broadening the sensitivity of onium salts photoinitiators at long wavelengths is through the use of photosensitizers. Polynuclear aromatic hydrocarbons such as anthracene, pyrene, and perylene have the requisite long wavelength absorption characteristics and also undergo efficient photoinduced electron-transfer photosensitization with onium salt photoinitiators.

Although polynuclear aromatic hydrocarbons are the most efficient known examples of electron-transfer photosensitizers for onium salts, they have several serious drawbacks that limit their use. For example, they are generally expensive, toxic, and poorly soluble in most reactive monomers and polymer systems. It has been shown that it is possible to prepare derivatives of these compounds that address these latter two issues. However, such derivatives remain prohibitively expensive for general-purpose uses. As a result, a need exists for long wavelength-active photosensitizers that overcome at least one of the aforementioned deficiencies.

SUMMARY OF THE INVENTION

An aspect of the present invention relates to a prepolymer mixture comprising: a photosensitizer component comprising from about 0.01 to about 10 parts by weight of curcumin or a curcuminoid; and a monomer component comprising from about 90 to about 99 parts by weight of a monomer chosen from oxetane monomers, epoxide monomers, and alkyl vinyl ether monomers, said prepolymer mixture containing less than 1% of polymerizable functionalities including acrylate groups and ethylenic groups not directly bonded to an oxygen.

A second aspect of the present invention relates to a method for coating a substrate comprising: applying a prepolymer mixture comprising: (i) a catalyst component comprising from about 0.5 to about 5 parts by weight of a cationic photoinitiator; (ii) a photosensitizer component comprising from about 0.01 to about 10 parts by weight of curcumin or a curcuminoid; and (iii) a monomer component comprising from about 90 to about 99 parts by weight of a monomer chosen from oxetane monomers, epoxide monomers, and alkyl vinyl ether monomers, to a substrate; and exposing said substrate and applied said prepolymer mixture to radiation.

A third aspect of the present invention relates to a coated substrate manufactured by said method described above.

A fourth aspect of the present invention relates to an ink comprising: a prepolymer mixture comprising: (i) a catalyst component comprising from about 0.5 to about 5 parts by weight of a cationic photoinitiator; (ii) a photosensitizer component comprising from about 0.01 to about 10 parts by weight of a curcumin or a curcuminoid; and (iii) a monomer component comprising from about 90 to about 99 parts by weight of a monomer chosen from oxetane monomers, epoxide monomers, and alkyl vinyl ether monomers; and a dye or a pigment.

A fifth aspect of the present invention relates to a kit for applying and curing a coating comprising:
  (a) a prepolymer mixture which comprises
    (i) a catalyst component comprising from about 0.5 to about 5 parts by weight of a cationic photoinitiator;
    (ii) a photosensitizer component comprising from about 0.01 to about 10 parts by weight of curcumin or a curcuminoid; and
    (iii) a monomer component comprising from about 90 to about 99 parts by weight of one or more of a monomer chosen from oxetane monomer, epoxide monomers; and alkyl vinyl ether monomers; and
  (b) instructions for separately applying and curing said prepolymer mixture.

A sixth aspect of the present invention relates to a method for increasing the rate of polymerization of an oxetane, epoxide or alkyl vinyl ether in the presence of a cationic photoinitiator said method comprising combining curcumin or a curcuminoid compound with said oxetane, epoxide, alkyl vinyl ether or combination thereof and a cationic photoinitiator; and A seventh aspect of the present invention relates to a kit for applying and curing a coating comprising:
(a) a prepolymer mixture which comprises
  (i) a photosensitizer component comprising from about 0.01 to about 10 parts by weight of curcumin or a curcuminoid; and
  (ii) a monomer component comprising from about 90 to about 99 parts by weight of one or more of a monomer chosen from oxetane monomer, epoxide monomers; and alkyl vinyl ether monomers, said prepolymer mixture containing less than 1% of polymerizable functionalities including acrylate groups and ethylenic groups not directly bonded to an oxygen; and
(b) a catalyst mixture comprising from about 0.5 to about 5 parts by weight of a cationic photoinitiator.

BRIEF DESCRIPTION OF THE DRAWINGS

FIG. 11 depicts a plot of an OP study of the photopolymerization of epoxidized soybean oil, carried out in the presence and absence of curcumin, in accordance with the present invention.

FIG. 12A depicts a four-layer glass cloth laminate infused with a solution of epoxidized linseed oil containing IOC-10 and curcumin, in accordance with the present invention.

FIG. 12B depicts a hard rigidified composite resulting from the irradiation of the laminate of FIG. 12A, in accordance with the present invention.

DETAILED DESCRIPTION OF THE INVENTION

Figure 1:
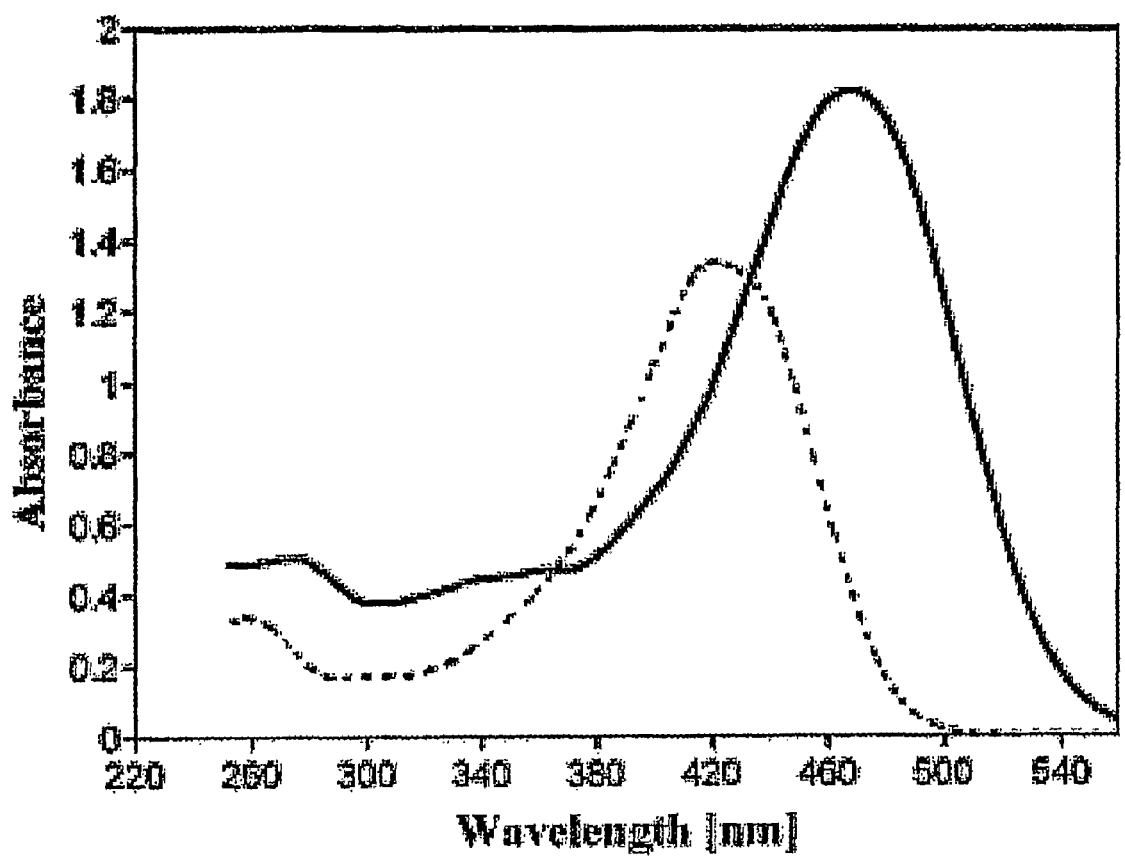
FIG. 1 depicts a plot of the UV-Vis spectrum of curcumin, in accordance with the present invention.

Throughout this specification the terms and substituents are defined when first introduced and retain their definitions.

The term alkyl is intended to include a linear, a branched, or a cyclic hydrocarbon structure, and combinations thereof. A lower alkyl refers to alkyl groups having from about 1 to about 6 carbon atoms. Examples of lower alkyl groups include but are not limited to methyl, ethyl, n-propyl, isopropyl, and n-, s- and t-butyl, and the like.

A cycloalkyl is a subset of alkyl and includes cyclic hydrocarbon groups having from about 3 to about 8 carbon atoms. Examples of cycloalkyl groups include but are not limited to cyclopropyl, cyclobutyl, cyclopentyl, cyclohexyl, norbomyl, and the like. Typical alkyl groups are those of $C_{20}$ or below in an embodiment of the present invention.

Examples of a $C_1$ to $C_{20}$ hydrocarbon include but are not limited to alkyl, cycloalkyl, alkenyl, alkynyl, aryl and combinations thereof. Examples include: tolyl, xylyl, benzyl, phenethyl, cyclohexylmethyl, camphoryl and naphthylethyl.

Oxaalkyl refers to alkyl residues in which one or more carbons have been replaced by oxygen. Examples include but are not limited to methoxypropoxy, 3,6,9-trioxadecyl and the like.

Aryl and heteroaryl mean a 5- or 6-membered aromatic or heteroaromatic ring containing 0-3 heteroatoms selected from O, N, or S; a bicyclic 9- or 10-membered aromatic or heteroaromatic ring system containing 0-3 heteroatoms selected from O, N, or S; or a tricyclic 13- or 14-membered aromatic or heteroaromatic ring system containing 0-3 heteroatoms selected from O, N, or S.

A prepolymer mixture is presented in accordance with the present invention. The prepolymer mixture comprises a photosensitizer component and a monomer component, with the mixture containing less than 1% of polymerizable functionalities. The polymerizable functionalities that are excluded are acrylate groups and ethylenic groups in which the unsaturated carbon is not directly bonded to oxygen. Examples of the aforementioned excluded ethylenic functional groups can be represented by the structures below and other like structures, wherein each of the wavy line(s) is a point(s) of attachment to an atom other than oxygen:

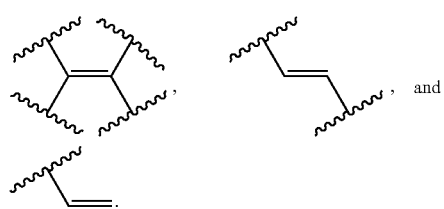

The terminology "less than 1%" means that for every 100 polymerizable oxetane, epoxide, or vinyl ether units present in a monomer and/or the prepolymer mixture, one unit or less of a polymerizable acrylate unit or an ethylenic unit not directly bonded to oxygen is present in the aforementioned monomer and/or prepolymer mixture. The polymerizable acrylate unit or an ethylenic unit may be part of the monomer, or present in the monomer and/or prepolymer mixture as a residue.

The photosensitizer component comprises curcumin or a curcuminoid compound. The photosensitizer component typically is present in the prepolymer mixture in an amount from about 0.01 to about 10 parts by weight.

Examples of the photosensitizer that may be used in an embodiment of the present invention include but are not limited to (E,E)-1,7-bis(4-hydroxy-3-methoxy-phenyl)-1,6-heptadiene-3,5-dione (i.e. curcumin) and curcuminoids: 1,7-diphenyl-1,6-heptadiene-3,5-dione; 1,7-bis(4-hydroxyphenyl)-1,6-heptadiene-3,5-dione; 1,7-bis(4-methoxy-phenyl)-1,6-heptadiene-3,5-dione; and 1,11-bis(phenyl)-1,3,8,10-undecatetraene-5,7-dione.

The examples of photosensitizers described above are not meant to limit the photosensitizers that may be used in accordance with the present invention. Any curcuminoid compound may be used in an embodiment of the present invention. A curcuminoid compound is a compound that differs from curcumin by one or two ethylene units, one or two phenols, one or two alkoxyls (methoxy in curcumin), one or two additional substituents on the phenol rings, one or two additional conjugated aromatic rings or a combination of the foregoing. The structure of curcumin is shown illustrating the keto-enol tautomers:

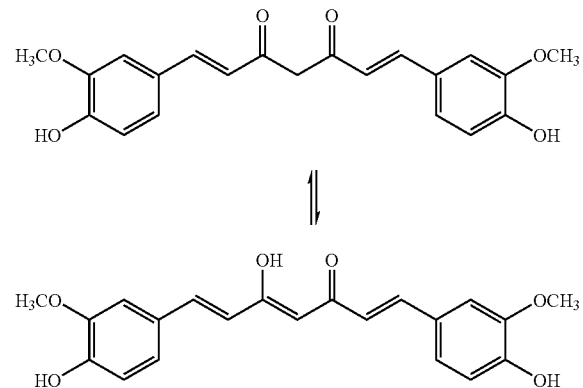

An important feature of curcumin for its present utility is the extended conjugation due to the presence of both the aromatic and the enol ether groups. Curcumin exists almost entirely in the enol form as shown in the structure below and this provides the highly conjugated chromophor responsible for the long wavelength absorption of UV and visible light of this compound.

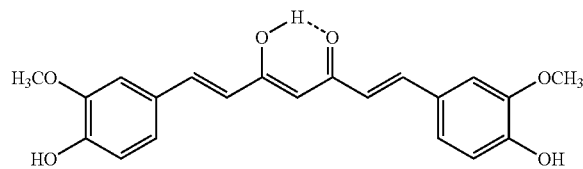

Also significant is the presence of the two electron-rich aromatic groups at both ends of the conjugated chain. These groups lower the oxidation potential of the molecule by facilitating the removal of an electron during the electron-transfer photosensitization process. Thus, also facilitating photopolymerization to occur at longer wavelengths in the UV region and wavelengths in the visible region.

Another feature is the presence of the methoxy and hydroxy groups respectively in the 3 and 4-positions of the terminal phenyl groups. This particular substitution results in a further bathochromic shift of the $\lambda_{max}$ of the absorption of this compound. The result again being that photopolymerization can occur at longer wavelengths in the UV region and wavelengths in the visible region.

Additionally, it is important to note that curcumin is a conjugated phenolic compound. Observations have indicated that curcumin has a low oxidation potential in the ground state and suggest that the oxidation potential may be further lowered on photoexcitation. The ability of a compound to undergo photoinduced one electron oxidation is essential for its activity as a photosensitizer. Analogues of curcumin, such as curcuminoids, incorporating the same extended conjugated diketone chromophor can be readily used for excellent photosensitizing activity.

Besides the broad long wavelength UV absorption and low toxicity, there are two additional properties of curcumin that make it an ideal photosensitizer for onium salts. First, curcumin is a slightly acidic dye that does not possesses basic or other groups that can retard, inhibit or otherwise interfere in cationic photopolymerizations. Second, curcumin is highly soluble in a wide range of polar and nonpolar monomers and polymers.

The monomer component may comprise one or more of a monomer chosen from oxetane monomers, epoxide monomers, and alkyl vinyl ether monomers. The oxetane and epoxide monomers may be free of other polymerizable functionalities, such as acrylates and ethylenic compounds not directly bound to an oxygen, or may contain these functionalities as incidental to the photopolymerization. By incidental is meant that the polymerization occurs between epoxide or oxetane groups and less than 10% of any "incidental" functionality disappears during polymerization. In one embodiment, the monomers are epoxides and oxetanes free of acrylates and ethylenic compounds not directly bound to an oxygen. In another embodiment, the monomers are epoxides and oxetanes containing vinylsilane or SiH groups. The monomer component typically is present in the prepolymer mixture in an amount from about 90 to about 99 parts by weight.

Examples of an oxetane monomer component that may be used in an embodiment of the present invention include but are not limited to 3-ethyl-3-phenoxymethyloxetane, 3-methyl-3-phenoxymethyloxetane, 3-ethyl-3-[(2-ethylhexyloxy)methyl]oxetane, bis{[(1-ethyl(3-oxetanyl)]methyl}ether, 1,4-bis[(3-ethyl-3-oxetanylmethoxy)methyl]benzene, bis[(3-ethyl-3-oxetanylmethoxy)methyl]terephthalate, bis[(3-ethyl-3-oxetanylmethoxy)methyl]phenyl ether, 2-phenyloxetane, 3,3-bischloromethyloxetane, 3,3-dimethyloxetane, 3,3-bisbromomethyloxetane, other like 3,3-substituted oxetanes.

Examples of an epoxide monomer component that may be used in an embodiment of the present invention include but are not limited to a benzyl glycidyl ether, an α,α-1,4-xylyl-diglycidyl ether, a bisphenol-A diglycidyl ether, cresyl glycidyl ether, an ethyleneglycol diglycidyl ether, a diethyleneglycol diglycidyl ether, a neopentylglycol diglycidyl ether, a 1,4-butanediol diglycidyl ether, a 1,4-cyclohexanedimethanol diglycidyl ether, a trimethylopropanetriol triglycidyl ether, a glycerol triglycidyl ether, a cresyl glycidyl ether, a diglycidyl phthalate, a cresol novolac epoxide, a phenol novolac epoxide, a bisphenol-A novolac epoxide, 3,4-epoxy-cyclohexylmethyl 3',4'-epoxycyclohexanecarboxylate, bis(3,4-epoxycyclohexylmethyl) adipate, limonene dioxide, 1,2-epoxydecane, 1,2-epoxydodecane, 1,2,7,8-diepoxyoctane, epoxidized soybean oil, epoxidized linseed oil, epoxidized castor oil, epoxidized natural rubber, epoxidized poly(1,2-butadiene), epoxy functional silicone resins, and the like.

Further examples of epoxides that maybe used in an embodiment of the present invention can be represented by the formula:

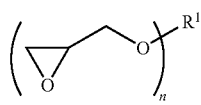

wherein n is an integer from 1-6. When n=1, $R^1$ is a monofunctional alkyl, cycloalkyl, arylalkyl, or heterocyclic alkyl group. When n is >1, $R^1$ is a di- or multifunctional alkylene or arylalkylene group. Examples of compounds include but are not limited to where n=2 are 1,4-butanediol diglycidyl ether, 1,4-xylyleneglycol diglycidyl ether; where n=3, trimethylopropane triglycidyl ether, glycerol triglycidyl ether; where n=4, pentaerythritol tetraglycidyl ether, ditrimethylopropane tetraglycidyl ether; and where n=6, dipentaerythritol hexaglycidyl ether.

Examples of alkyl vinyl ether monomers that may be used in an embodiment of the present invention include but are not limited to 2-chloroethyl vinyl ether, triethylene glycol divinyl ether, cyclohexanedimethanol divinyl ether, 1,4-butanediol divinyl ether, and the like. The vinyl ether monomers may be free of other polymerizable functionalities, such as acrylates, or may contain these functionalities as incidental to the photopolymerization. In one embodiment, the monomers are acrylate-free vinyl ethers. In another embodiment, the monomers are vinyl ethers containing vinylsilane or SiH groups. The alkyl vinyl ether monomer component typically is present in the prepolymer mixture in an amount from about 90 to about 99 parts by weight.

Monomers that contain two or more polymerizable functional groups are classified, i.e. named, based on the predominant functional group present. For example, a monomer having 70 units of an epoxide functionality and 30 units of an acrylate functionality would be named an epoxide monomer in accordance with the present invention. Another example is a monomer containing 98 units of an oxetane functionality and 2 units of an ethylenic functionality. The monomer would be referred to as an oxetane monomer and not an olefin monomer in accordance with the present invention. The aforementioned examples are meant to clarify how to classify or name monomers that contain two or more polymerizable functional groups. The examples are not meant to describe the actual ratio or ranges of functional groups in a monomer that may be used in accordance with the present invention. One ordinarily skilled in the art would be able to distinguish between monomers having multiple polymerizable functionalities capable for use in the present invention and monomers having multiple functionalities that would be excluded from use in the present invention.

The prepolymer mixture was prepared by independently combining a preselected photosensitizer and a monomer listed above to form a homogeneous solution containing the aforementioned.

In another embodiment of the present invention, the prepolymer mixture may additionally contain a catalyst component. The catalyst component is a cationic photoinitiator chosen from the group consisting of a diaryl- or triarylsulfonium salt; a diaryliodonium salt; a dialkylphenacylsulfonium salt; and the like. Examples of cationic photoinitiators may be found in journal publications to Crivello, J. V.; Lee, J. L. Alkoxy-Substituted Diaryliodonium Salt Cationic Photoinitiators. *J. Polym. Sci. Part A: Polym. Chem. Ed.* 1989, 27, 3951; S. R. Akhtar, J. V. Crivello, J. L. Lee, *J. Org. Chem.* 55 (1990) 4222; Akhtar et al., *Chem. Mater.* 2, 732-737 (1990); J. V. Crivello, S. Kong, *Macromolecules* 33 (2000) 833, and U.S. Pat. Nos. 4,882,201; 4,941,941; 5,073,643; 5,274,148; 6,031,014; 6,632,960; and 6,863,701, all of which are incorporated herein by reference.

The aforementioned salts have cations chosen from the group consisting of $BF_4^-$, $PF_6^-$, $AsF_6^-$, $SbF_6^-$, $GAF_6^-$, $TaF_6^-$, $B(C_6F_5)_4^-$, and $(C_6F_5SO_2)_2CH^-$. The cationic photoinitiator is present in the prepolymer mixture in an amount from about 0.5 to about 5 parts by weight, i.e. about 0.5% to about 5% by weight of mixtures that consist only of initiator, photosensitizer, and oxetane, expoxide, or alkyl vinyl ether.

The examples of diaryliodonium cationic photoinitiators described above are not meant to limit the kinds of diaryliodonium cationic photoinitiators that may be used in accordance with the present invention. Diaryliodonium salts that may be used in an embodiment of the prepolymer mixture and method (described infra) of the present invention include salts of the following formula:

Ar—I$^+$—Ar' MtX$_n^-$

In the above structure, Ar and Ar' are the same or different aryl groups that may bear from 0 to 5 substitutents. Those substituents may be aliphatic, aromatic, halo, haloalkyl, nitro, keto, alkoxy, or may contain hydroxyl groups, carboxylic acid groups, unsaturated groups or alkylaryl groups. Further, Ar and Ar' may also represent heterocyclic groups such as furan, thiophene, thioxanthene, thioxanthone or thianthrene groups. In the above structure, $MtX_n^-$ represents an anion of low nucleophilicity.

The prepolyiner mixture additionally comprising the catalyst component was prepared by independently combining a preselected catalyst component, a photosensitizer and a monomer listed above to form a homogeneous solution containing the aforementioned.

The prepolymer mixtures of the present invention may additionally comprise one or more of a photosensitizer, a filler, a colorant, a surface active agent, or a leveling agent. The total combined amount of the aforementioned components present in the prepolymer mixture typically is from about 1 to about 20 parts by weight in an embodiment of the present invention.

Examples of a filler that may be used in an embodiment of the present invention include but are not limited to inorganic particulate fillers such as silica, talc or clays. Examples of reinforcing fibers include glass, poly(ethylene), carbon, and polyimide fibers, as well as impact modifiers, such as core-shell type elastomers, and the like. Examples of a colorant or dye that may be used include but are not limited to copper phthalocyanine, carbon black, dayglow pigments, iron oxide, titanium dioxide, zinc oxide, copper oxide, cadmium sulfide, and the like.

Examples of a surface active agent that may be used in embodiment of the present invention include but are not limited to polyethylene glycol-silicone copolymers, fluorinated silicones, fluorinated alkyl ethers, and the like. Examples of leveling and matting agents that may be used include but are not limited to silicones, stearyl alcohol, oleic acid, poly(ethylene) wax, carnauba wax, zein wax, poly(tetrafluoroethylene), and the like.

A method for coating a substrate is presented in accordance with the present invention. The method comprises: applying a prepolymer mixture to a substrate; and exposing the substrate and the applied prepolymer mixture to radiation. The prepolymer mixture comprises (i) a catalyst component comprising from about 0.5 to about 5 parts by weight of a cationic photoinitiator; (ii) a photosensitizer component comprising from about 0.01 to about 10 parts by weight of curcumin or a curcuminoid; and (iii) a monomer component comprising from about 90 to about 99 parts by weight of a monomer chosen from oxetane monomers, epoxide monomers, and alkyl vinyl ether monomers, to a substrate Examples of techniques for applying the prepolymer mixture to a substrate include but are not limited to dip, roll, brush, pad or spray coating, screen printing, needle dispensing, and other like application techniques. Examples of a substrate that may be used in an embodiment of the present invention include but are not limited to a polymer material, a glass material, a wood material, a metal material, a textile material, a ceramic material, and combinations thereof.

Radiation is understood in the art as electromagnetic radiation in the wavelengths that initiate photochemical reactions. This functional definition is intended for the term as it is used in the present application. An example of radiation that may be used in an embodiment of the present invention is long wavelength ultraviolet (UV) light to visible (VIS) light. Typically, the radiation of the present invention is of a wavelength in a range from about 300 nanometers (nm) to about 500 nm.

EXPERIMENTAL

Materials

Curcumin (65-70%) and all organic starting materials, reagents and monomers employed in this investigation were reagent quality and were used as purchased from the Aldrich Chemical Co. (Milwaukee, Wis.) unless otherwise noted. Curcumin was purified prior to use by recrystallization from isopropyl alcohol. The difunctional oxetane monomer, bis{[lethyl(3-oxetanyl)]}methyl ether (DOX) was supplied as a gift from Toagosei Chemical Industries, Ltd. Nagoya, Japan. The diepoxide 3,4-epoxycyclohexylmethyl 3',4'-epoxycyclohexanecarboxylate (ERL-4221E) was obtained from the Union Carbide Corp. (Bound Brook, N.J.). Epoxidized soybean (ESO) and epoxidized linseed (ELO) oils were supplied as samples by the Viking Chemical Co. Minneapolis, Minn.). Unless otherwise noted, all other reagents, monomers and photoinitiators were used as received without further purification.

The diaryliodonium salt, triarylsulfonium salt, and arylsulfonium salt photoinitiators were prepared according to literature procedures, Crivello, J. V.; Lee, J. L. *J. Polym. Sci., Part A: Polym Chem. Ed.,* 1989, 27, 3951; Akhtar, S. R.; Crivello, J. V.; Lee, J. L. *J. Org. Chem.,* 1990, 55, 4222; and Crivello, J. V.; Kong, S. *Macromolecules,* 2000, 33, 833 which are both incorporated in there entirety herein by reference. A variety of these photoinitiators were employed and we have developed shorthand designations for these compounds. For example, IOC-10 $SbF_6$ refers to (4-n-decyloxyphenyl) phenyliodonium hexafluoroantimonate having the structure shown below in which a 10 carbon linear chain alkoxy groups is attached to one of the phenyl groups in the 4-position while $SbF_6$ denotes the hexafluoroantimonate anion. In a similar manner, SOC-10 $SbF_6$ refers to S(4-n-dodecyloxyphenyl)-S, S-diphenylsulfonium hexafluoroantimonate with the structure indicated below. Further, DPS-$C_1C_{12}$ $SbF_6$ refers to S-dodecyl-S-methyl-S-phenacylsulfonium with the structure indicated below.

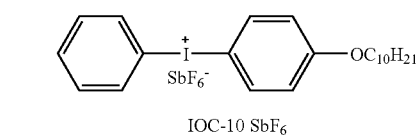

IOC-10 $SbF_6$

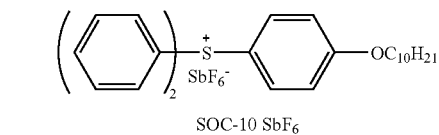

SOC-10 $SbF_6$

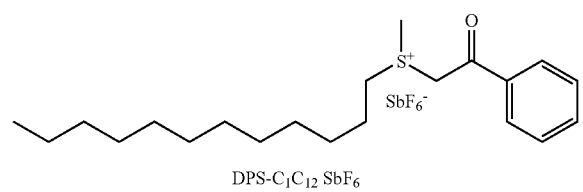

DPS-$C_1C_{12}$ $SbF_6$

Fluorescence Quenching Studies

Curcumin fluorescence quenching studies were conducted on a Perkin-Elmer LS-3B Fluorescence Spectrometer. An excitation wavelength of 304 mn was used and the fluorescence emission band at 501 nm was monitored. The curcumin concentration was $1 \times 10^{-3}$ M in tetrahydrofuran.

Synthesis of Curcumin and Curcuminoids

A modification of the literature procedure according to Babu, K. V. D.; Rajasekharan, P. B. *Org. Perp. Internl. Briefs,* 1994, 26(6), 674 was used to prepare curcumin and the other curcuminoids reported in Table 1. The synthesis of curcumin described infra is typical of the procedures used for all the curcuminoids of the present invention. Into a clean vial was placed 1.53 g (0.01 mol) of vanillin, 0.51 mL of acetylacetone, 1 g of boric acid and 1 mL of dimethylformamide. The mixture was heated for 5 minutes in a water bath at 80-90° C. Then a mixture of 0.1 mL of 1,2,3,4-tetrahydroquinoline, 0.3 mL of glacial acetic acid and 1 mL of dimethylformamide was added and heating continued at 80-90° C. for 4 hours. After cooling, 50 mL of 20% aqueous acetic acid was added with vigorous stirring. The precipitated yellow-orange precipitate of curcumin was isolated by filtration, washed with water and dried. The product was further purified by recrystallization from isopropyl alcohol.

TABLE 1

Structure, Physical Characteristics and Spectra of Some Curcuminoids

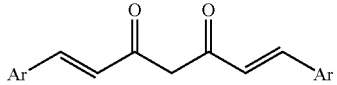

| Notation | Structure (Ar) | Yield (%) | m.p. (° C.) | Lit. m.p. (° C.) | UV $\lambda_{max}$ (nm) |
| --- | --- | --- | --- | --- | --- |
| I | 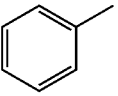 | 56 | 182 | 183 | 427 |
| II | 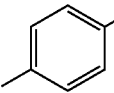 | 53 | 138-140 | 140-142 | 384 |
| III | 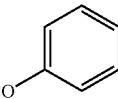 | 59 | 212-220 | 209-211 | 421 |
| IV | 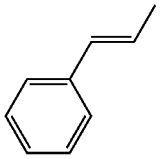 | 41 | 163-166 | 166-168<br>164-165 | 398 |
| V |  | 21 | 185-190 | 184-185<br>189-190 | 427<br>454 (wk) |

Kinetic Characterization of Photopolymerization Reactions

The analytical techniques and apparatus referred to in the present application are Fourier transform real-time infrared spectroscopy (FT-RTIR) and optical pyrometry (OP), both of which are described in Crivello, J. V.; Acosta Ortiz, R. J *Polym Sci Part A: Polym Chem* 2001, 39(20), 3578, Falk, B.; Vallinas, S. M; Crivello, J. V. *J Polym Sci Part A: Polym Chem Ed* 2003, 41(4), 579, and Falk, B.; Vallinas, S. M; Crivello, J. V. *Polym Mat Sci Eng Prepr* 2003, 89, 279, all of which are incorporated in their entirety herein by reference. The LED array used in conjunction with the OP was supplied by the Naval Warfare Systems Command, Panama City, Fla.

The FT-RTIR experiments to be described were performed at room temperature using broadband UV light emitted by a medium Hg arc source and filtered through a liquid optic light pipe. The transmitted light radiation consists entirely of wavelengths greater than 300 nm. In a given system, the intensity of the UV light was adjusted so that the photopolymerization could be completed within a period of approximately 150-250 seconds. Three kinetic runs were obtained for the photopolymerization of each monomer and the results averaged to obtain the final conversion versus time curve.

Samples for FT-RTIR and OP analysis were prepared as follows: homogeneous solutions of the desired monomer with the designated photoinitiator were prepared (all concentrations are given in mol % with respect to the monomer unless otherwise noted). A 10 µm corona treated oriented polypropylene film was first laid down and a thin polyester fiber mesh to serve as a spacer was placed on top of the plastic film. The liquid sample was placed onto this assembly and an identical layer of poly(propylene) film was placed over the top. The resulting sample sandwich was mounted in a 2.0 cm×2.0 cm plastic slide holder and irradiated with LV light using a UVEX Model SCU-110 mercury lamp and directed via a 95 cm liquid light pipe onto the sample. The end of the wand was placed at a predetermined distance and directed at an incident angle of 45° onto the sample window. All OP experiments were conducted at ambient temperature (25-28° C.). In every case, the samples were allowed to equilibrate and establish a flat baseline for 20 seconds prior to the start of the UV irradiation. Temperature data was collected at a rate of 1 measurement per second and directly recorded and downloaded to an IBM 350-P137 personal computer for analysis. Several kinetic runs were performed for each polymerizable system and the results reported in this article were the average of at least three kinetic runs.

The above OP apparatus was modified in two ways. For example, a Schott BG-12 optical filter with a midpoint transmission wavelength of 407 nm and a transmission band of approximately 355-460 nm (wavelengths at which the transmittance is $t_{max}/2$) was placed at the end of the light pipe to provide a narrow wavelength irradiation beam. The OP apparatus also was modified to accommodate a circular array composed of 22 individual InGaN LED devices as a light source. The LED array was positioned directly beneath the sample stage. The array was energized with a common 6V battery. The peak emission wavelength of the array was 470 nm. The preparation of the samples and the collection of the data using this apparatus was the same as employed in the UV-vis OP studies.

Solar Irradiation Induced Polymerization

A glass cloth was impregnated with a solution of epoxidized linseed oil containing 1.0 mol % IOC-10 $SbF_6$ and 0.1 mol % curcumin. Four layers of the impregnated cloth were stacked on top of one another on a polyethylene film and the resulting laminate was exposed to direct solar irradiation for 10 minutes at Troy, New York (latitude 420 North) on Apr. 6, 2005 commencing at 15:00 h. The ambient temperature during the irradiation was 25° C. After 5 minutes of continuous irradiation, the composite was tack-free to the touch. Irradiation was continued for an additional 5 minutes to ensure completion of the photopolymerization. After this time, the orange-colored composite was fully hardened. It was removed from the polyethylene backing and was trimmed.

EXAMPLES

Example 1

FIG. 1 depicts a plot of the UV spectrum of curcumin, in accordance with the present invention. The UV spectrum of curcumin was measured in acidic and basic media. Referring to FIG. 1, the plot shows that curcumin possesses broad UV absorption from 300-500 nm that is strongly solvent and pH dependent due to the presence of the phenolic groups. The strong UV absorption band at 427 nm (s=55000) is of particular importance for the photosensitization of onium salts in neutral or acidic media. Curcumin exists almost entirely in the enol form as shown in the structure below and this provides the highly conjugated chromophor responsible for the long wavelength absorption of this compound. Also significant is the presence of the two electron-rich aromatic groups at both ends of the conjugated chain. These groups are expected to lower the oxidation potential of the molecule by facilitating the removal of an electron during the electron-transfer photosensitization process.

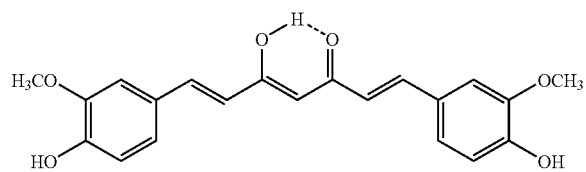

Example 2

Figure 2:
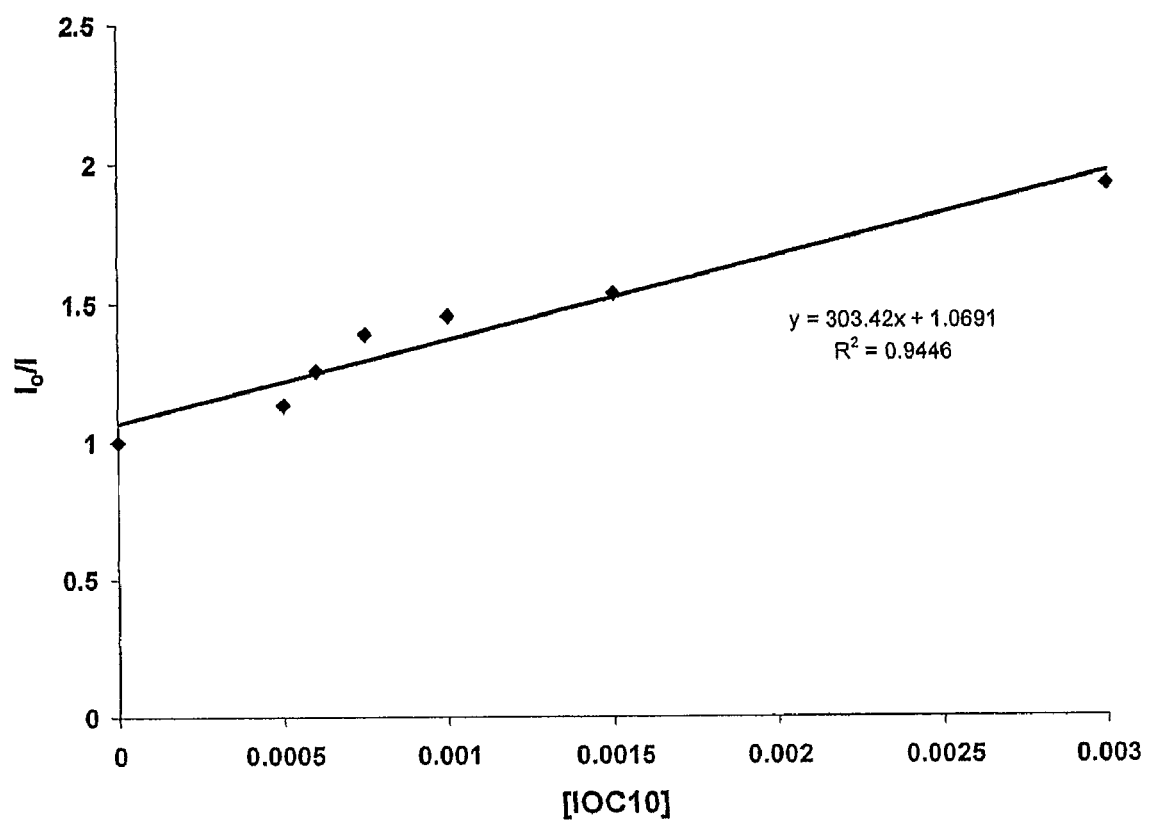
FIG. 2 depicts a Stern-Volmer plot of a study of the fluorescence quenching of curcumin as a function of diaryliodonium salt concentration, in accordance with the present invention.

FIG. 2 depicts a Stern-Volmer plot of a study of the fluorescence quenching of curcumin as a function of diaryliodonium salt concentration, in accordance with the present invention. The quenching study was performed as described supra. Curcumin displays a blue solvent-dependent fluorescence emission (446-549 nm) when irradiated with UV light (excitation at 355 nm). Referring to FIG. 2, in the presence of an onium salt, the fluorescence of curcumin is markedly quenched due to electron-transfer. The linear correlation shown in the plot is strong confirming evidence for the electron-transfer photosensitization mechanism believed to occur. During the photolysis, there is a rapid and marked change in the color of the solution indicative of the formation of the curcumin radical-cation and the further reaction of this species with solvent or monomer to form various secondary products.

Example 3

Figure 3:
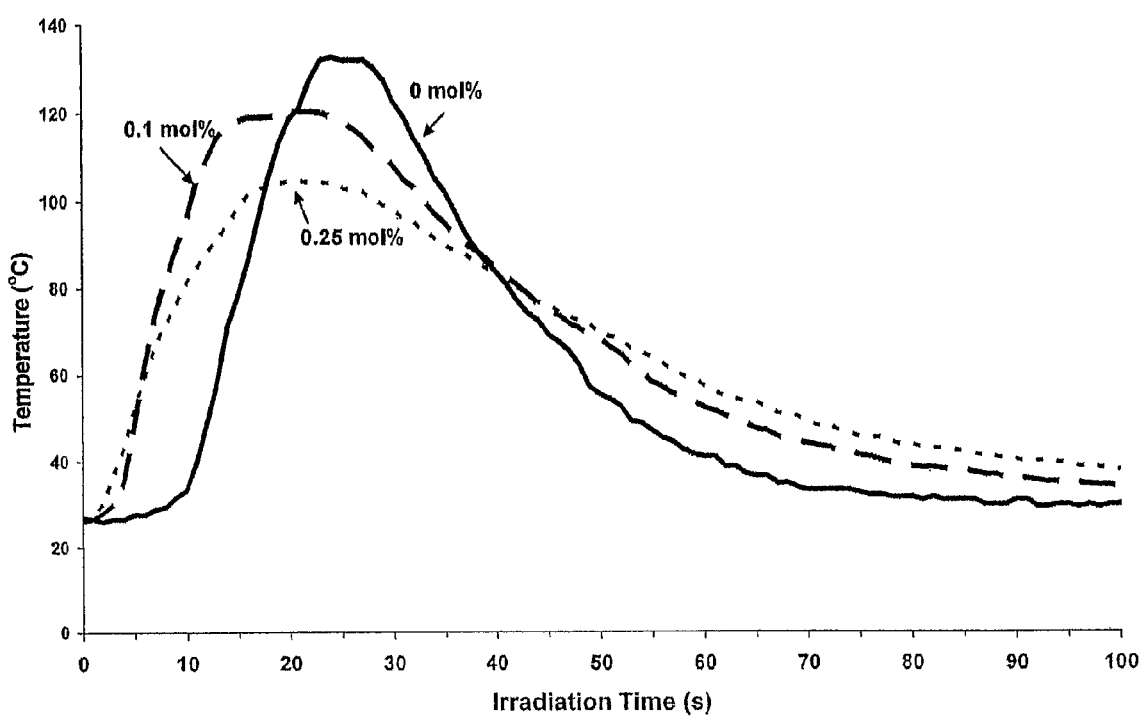
FIG. 3 depicts a plot of an Optical Pyrometry (OP) study of the photopolymerization of an epoxide monomer, cyclohexene oxide (CHO,) carried out in the presence and absence of curcumin, in accordance with the present invention.

FIG. 3 depicts a plot of an OP study of the photopolymerization of an epoxide monomer, cyclohexene oxide (CHO,) carried out in the presence and absence of curcumin, in accordance with the present invention. In a glass vial fitted with a small magnetic stirrer, there was dissolved 0.1 g of the cationic photoinitiator IOC15 $SbF_6$ and 10 g of CHO. The liquid sample was placed on an assembly comprising a 10 μm corona treated oriented polypropylene film with a thin polyester fiber mesh laid down on top to serve as a spacer. An identical layer of polypropylene film was then placed on top of the liquid sample. The resulting sample sandwich was mounted in a 2.0 cm×2.0 cm plastic slide holder and irradiated with UW light (light intensity of 387 $mJ/cm^2$ min) at wavelengths of 300 nm or greater.

Referring to FIG. 3, three concentrations of curcumin (0 mol %, 1.0 mol % and 0.25 mol %) were used in the photopolymerization reactions. As noted in this figure, the photopolymerization in the presence of the curcumin takes place very rapidly and substantially without an induction period as compared to when the curcumin is absent. The optimum curcumin concentration for this particular photopolymerization was found to be 0.1-0.25 mol %.

Example 4

Figure 4:
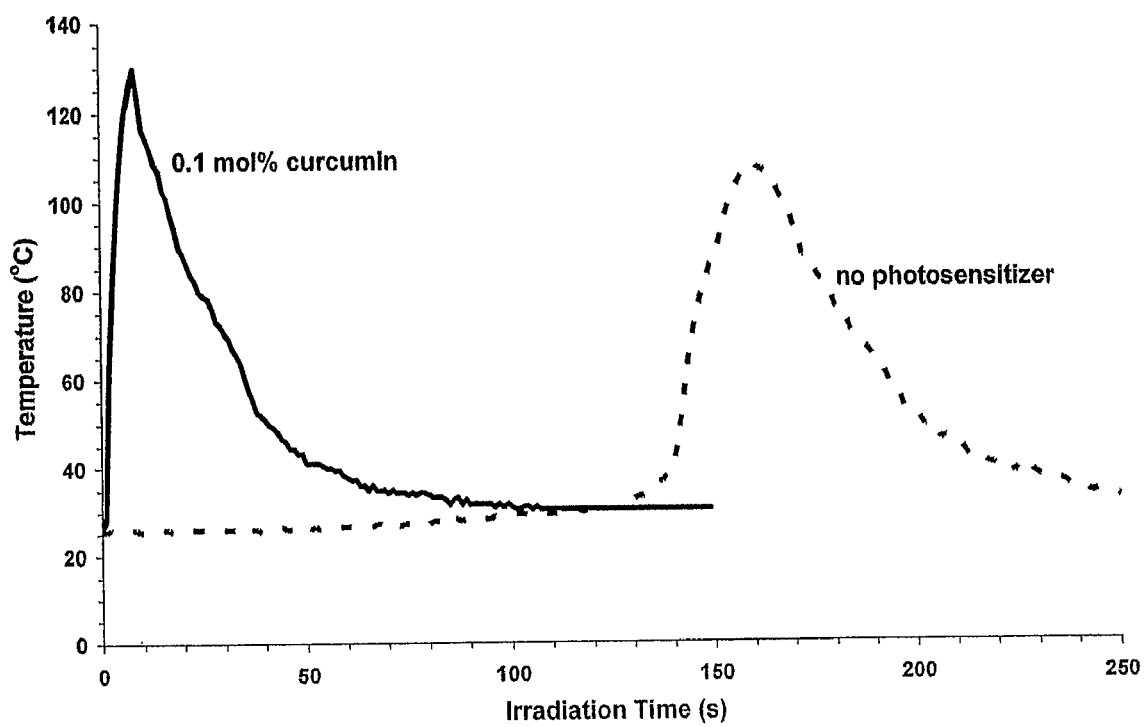
FIG. 4 depicts a plot of an OP study of the photopolymerization of CHO carried out in the presence and absence of curcumin using an optical filter, in accordance with the present invention.

FIG. 4 depicts a plot of an OP study of the photopolymerization of CHO carried out in the presence and absence of curcumin using an optical filter, in accordance with the present invention. The photoinitiator used in this study was IOC10 $SbF_6$ at a 1.0 mol %. Curcumin was present at a 0.1 mol % level. The optical filter permits the passage of only a relative narrow band (midpoint 407 nm) of irradiation with wavelengths from 355-460 nm. The light intensity was 387 $mJ/cm^2$min. Referring to FIG. 4, in the absence of curcumin, photopolymerization of CHO proceeds only after a very long induction period and then rather slowly. In contrast, when curcumin is present, immediate polymerization of CHO takes place rapidly and exothermically when irradiation is commenced.

Example 5

Figure 5:
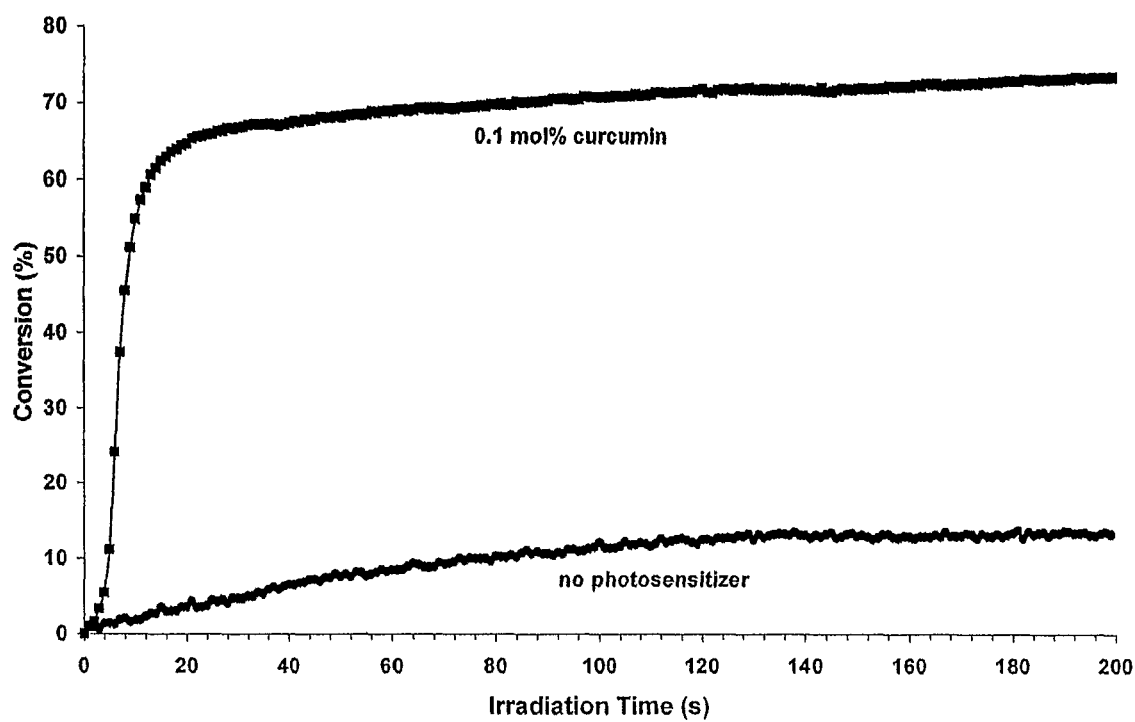
FIG. 5 depicts a plot of a Fourier transform real-time infrared (FT-RTIR) spectroscopy study of the photopolymerization of CHO, in accordance with the present invention.

FIG. 5 depicts a plot of FT-RTIR study of the photopolymerization of CHO, in accordance with the present invention. The study is a parallel to the OP study described above. Curcumin was present at a 0.1 mol % level. The photoinitiator used in this study was IOC10 $SbF_6$ at a 1.0 mol %. The infrared (IR) band at 782 $cm^{-1}$ corresponding to the epoxy group of CHO was monitored. Referring to FIG. 5, the conversion of the CHO monomer takes place much more rapidly in the presence of the curcumin as compared to when it was absent.

Example 6

Figure 6:
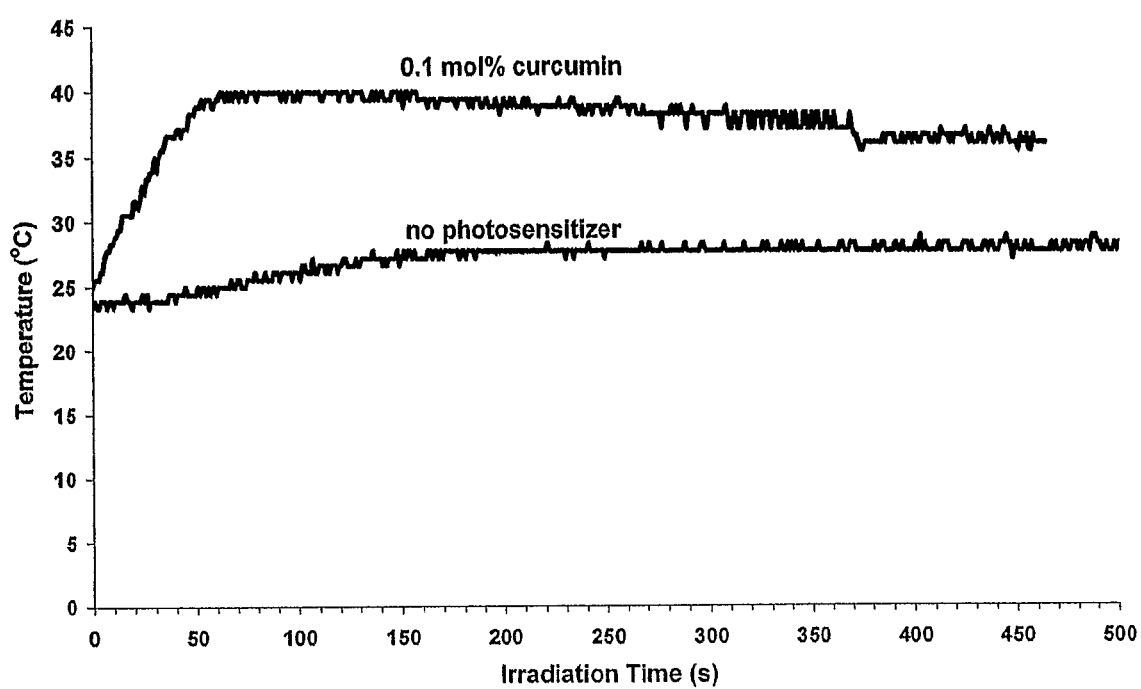
FIG. 6 depicts a plot of a second OP study of the photopolymerization of CHO carried out in the presence and absence of curcumin using an optical filter, in accordance with the present invention.

FIG. 6 depicts a plot of a second OP study of the photopolymerization of CHO carried out in the presence and absence of curcumin using an optical filter, in accordance with the present invention. Curcumin was present at a 0.1 mol % level. The photoinitiator used in this study was SOC10 $SbF_6$ at a 1.0 mol %. The optical filter permits the passage of only a relative narrow band (midpoint 407 nm) of irradiation with wavelengths from 355-460 nm. The light intensity was 1510 $mJ/cm^2$min. Similar results were obtained for DPS-CIC$_{12}$ $SbF_6$. Referring to FIG. 6, there is clearly an enhancement of the photopolymerization in the presence of curcumin, though the effect is considerably less pronounced than in the case of diaryliodonium salts (refer to FIG. 4).

Example 7

Figure 7:
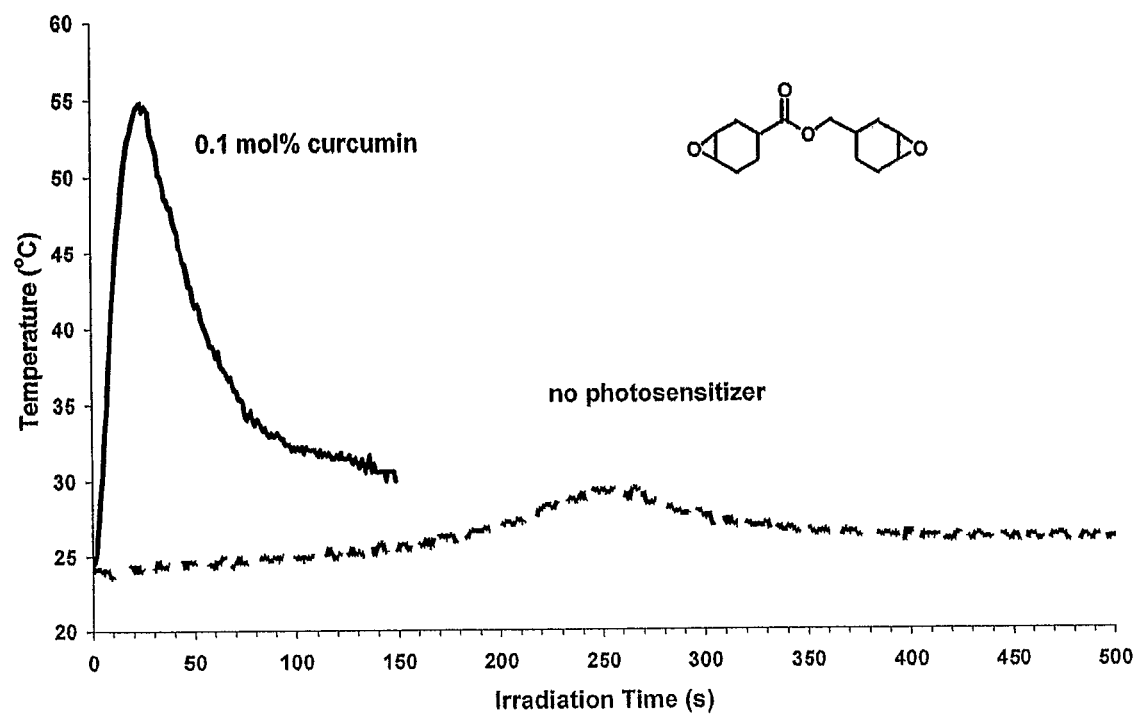
FIG. 7 depicts a plot of an OP study of the photopolymerization of a difunctional epoxide monomer, 3,4-epoxycyclohexylmethyl 3',4'-epoxycyclohexane carboxylate (ERL-4221E), carried out in the presence and absence of curcumin, in accordance with the present invention.

FIG. 7 depicts a plot of an OP study of the photopolymerization of a difunctional epoxide monomer, 3,4-epoxycyclohexylmethyl 3',4'-epoxycyclohexane carboxylate (ERL-4221E), carried out in the presence and absence of curcumin using an optical filter, in accordance with the present invention. Curcumin was present at a 0.1 mol % level. The photoinitiator used in this study was IOC10 $SbF_6$ at a 1.0 mol %. The optical filter permits the passage of only a relative narrow band (midpoint 407 nm) of irradiation with wavelengths from 355-460 nm. The light intensity was 1482 $mJ/cm^2min$. Referring to FIG. 7, there is clearly an enhancement of the photopolymerization in the presence of curcumin as compared to its absence.

Example 8

Figure 8:
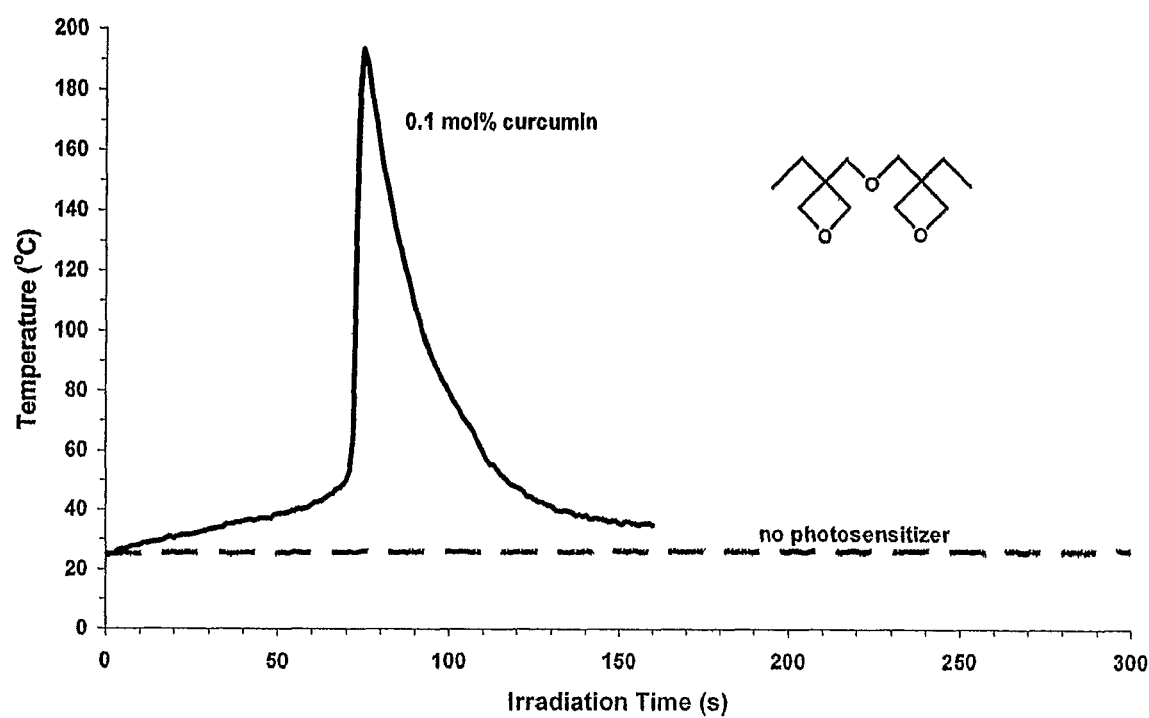
FIG. 8 depicts a plot of an OP study of the photopolymerization of a difunctional oxetane monomer, bis{[1ethyl(3-oxetanyl)]}methyl ether (DOX), carried out in the presence and absence of curcumin, in accordance with the present invention.

FIG. 8 depicts a plot of an OP study of the photopolymerization of a difunctional oxetane monomer, bis {[1ethyl(3-oxetanyl)]}methyl ether (DOX), carried out in the presence and absence of curcumin (0.1 mol %) using an optical filter, in accordance with the present invention. The photoinitiator used in this study was IOC10 $SbF_6$ at a 1.0 mol %. Irradiation wavelengths were from 355-460 nm with a midpoint 407 nm. The light intensity was 1500 $mJ/cm^2min$. Referring to FIG. 8, there is clearly an enhancement of the photopolymerization in the presence of curcumin as compared to its absence. No polymerization was observed even after 5 minutes irradiation in the absence of curcumin whereas when this dye present, polymerization takes place rapidly and exothermically.

Example 9

Figure 9:
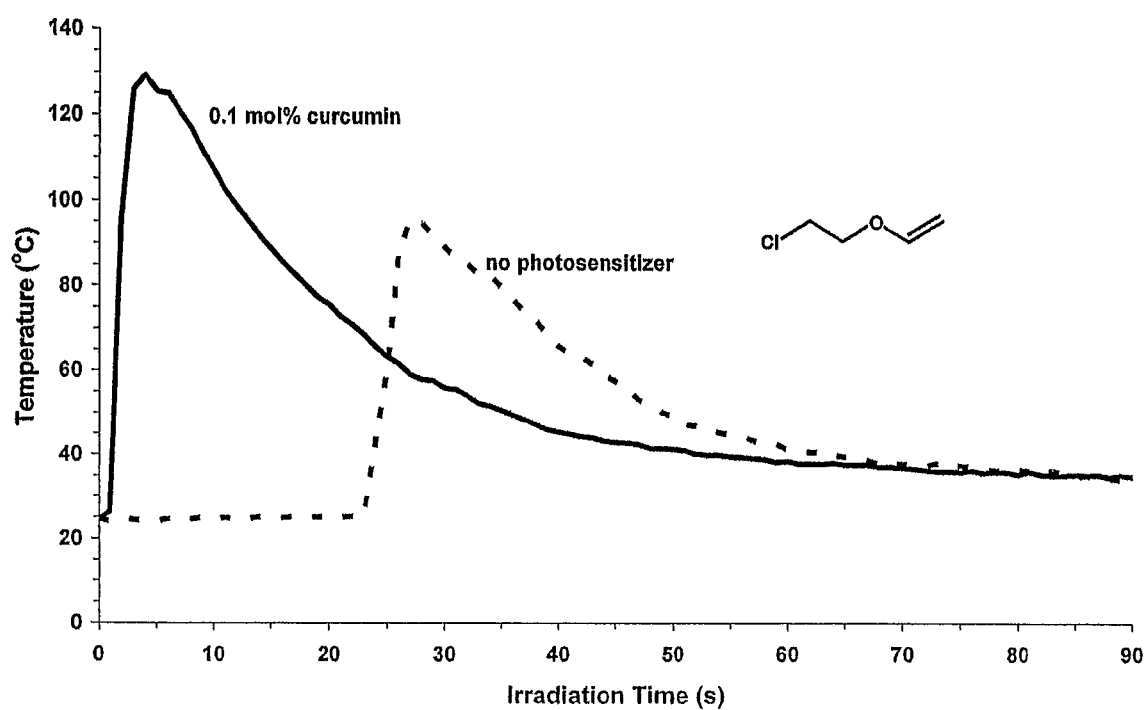
FIG. 9 depicts a plot of an OP study of the photopolymerization of a vinyl ether monomer, 2-chloroethyl vinyl ether, carried out in the presence and absence of curcumin, in accordance with the present invention.

FIG. 9 depicts a plot of an OP study of the photopolymerization of a vinyl ether monomer, 2-chloroethyl vinyl ether, carried out in the presence and absence of curcumin (0.1 mol %) using an optical filter, in accordance with the present invention. The photoinitiator used in this study was IOC10 $SbF_6$ at a 1.0 mol %. Irradiation wavelengths were from 355-460 nm with a midpoint 407 mn. The light intensity was 1500 $mJ/cm^2min$. The 2-chloroethyl vinyl ether monomer was selected for use since it is highly reactive as well as moderately polar and readily dissolves both curcumin and the diaryliodonium salt photoinitiator. Referring to FIG. 9, the photopolymerization of 2-chloroethyl vinyl ether is readily initiated in the presence curcumin whereas in its absence polymerization takes place only after a prolonged induction period.

Example 10

Figure 10:
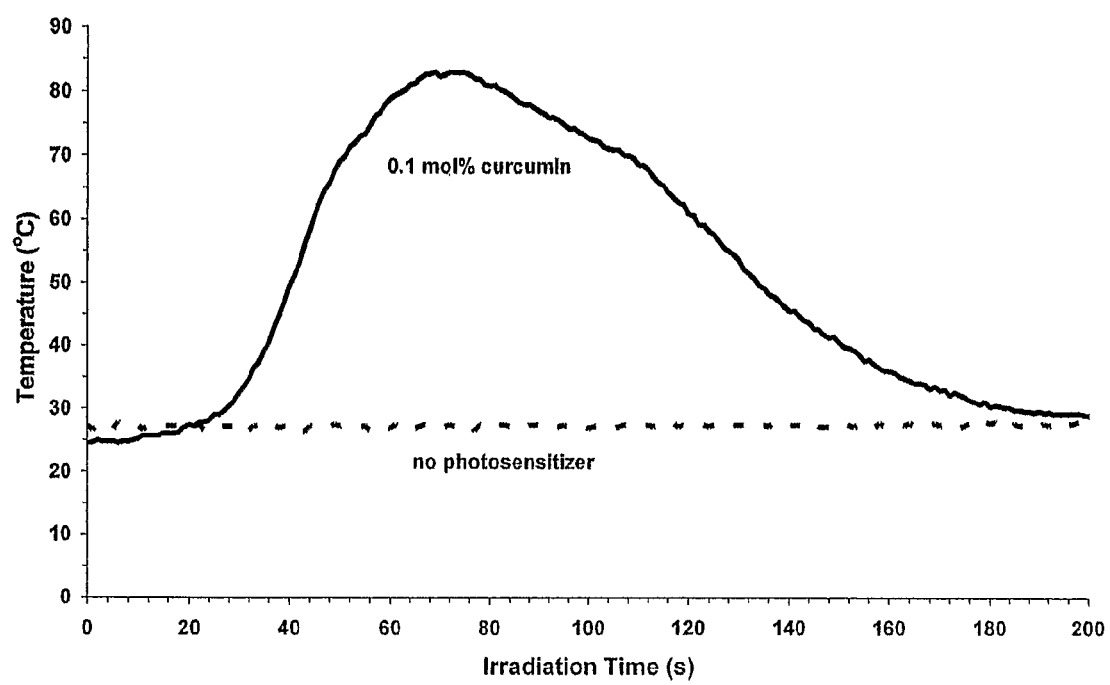
FIG. 10 depicts a plot of an OP study of the photopolymerization of a CHO, carried out in the presence and absence of curcumin, and using light emitting diodes, in accordance with the present invention.

FIG. 10 depicts a plot of an OP study of the photopolymerization of a CHO, carried out in the presence and absence of curcumin (0.1 mol %) using light emitting diodes, in accordance with the present invention. The photoinitiator used in this study was IOC10 $SbF_6$ at a 1.0 mol %. An array of twenty-two InGaN light emitting diodes (LEDs) with a narrow band emission centered at 470 nm were used to provide the irradiation. The light flux generated from this battery powered light source is very low. Referring to FIG. 10, the polymerization proceeds satisfactorily in the presence of curcumin with the temperature of the sample reaching a maximum of 83° C. In contrast, no polymerization is observed in the absence of the dye even after prolonged irradiation times. contrast, no polymerization is observed in the absence of the dye even after prolonged irradiation times.

Example 11

FIG. 11 depicts a plot of an OP study of the photopolymerization of epoxidized soybean oil, carried out in the presence and absence of curcumin using an optical filter in accordance with the present invention. Curcumin was present at a 0.1 mol % level. The photoinitiator used in this study was IOC10 $SbF_6$ at a 1.0 mol %. Irradiation wavelengths were from 355-460 nm with a midpoint 407 nm. The light intensity was 1500 $mJ/cm^2min$. The reactivity of this system is quite good and the product is a flexible crosslinked polymer. Referring to FIG. 10, although the chief absorption band of curcumin lies at 427 nm, there is appreciable absorption well into the short wavelength visible region of the spectrum. For this reason, curcumin can be used as a photosensitizer for the solar radiation induced polymerization of epoxidized soybean oil as well as other epoxidized vegetable oils and epoxidized rubbers.

The photopolymerization of epoxidized soybean oil as well as other epoxidized vegetable oils and epoxidized rubbers for use in construction of building and roofing panels, boats, water delivery and sewage systems was demonstrated by the irradiation of a laminate infused with a solution of epoxidized linseed oil to form a hard rigid polymer composite.

Example 12

FIG. 12A depicts a four-layer glass cloth laminate infused with a solution of epoxidized linseed oil, containing IOC-10 (1.0 mol %) and curcumin (0.1 mol %).

FIG. 12B depicts a hard rigidified composite resulting from the irradiation of the laminate of FIG. 12A.

Referring to FIG. 12A and 12B, the laminate was subjected to direct solar irradiation for 10 min. The irradiation conditions are described in detail in the experimental portion of this article. At the start of the irradiation (FIG. 12A), the intense yellow color of the composite is apparent. As the irradiation continues, the yellow color is discharged and the composite rapidly takes on a pronounced orange coloration (FIG. 12B). Coincident with the color change is the exothermic crosslinking polymerization of the epoxidized linseed oil that can be noted by first, a loss of surface tack then stiffening of the composite. The aforementioned changes took place over the course of 5 minutes of continuous solar irradiation. Exposure was continued for an additional 5 minutes to ensure completion of the crosslinking polymerization. After termination of the irradiation, the hard rigidified composite was removed from the polyethylene backing and trimmed.

Example 13

Figure 13:
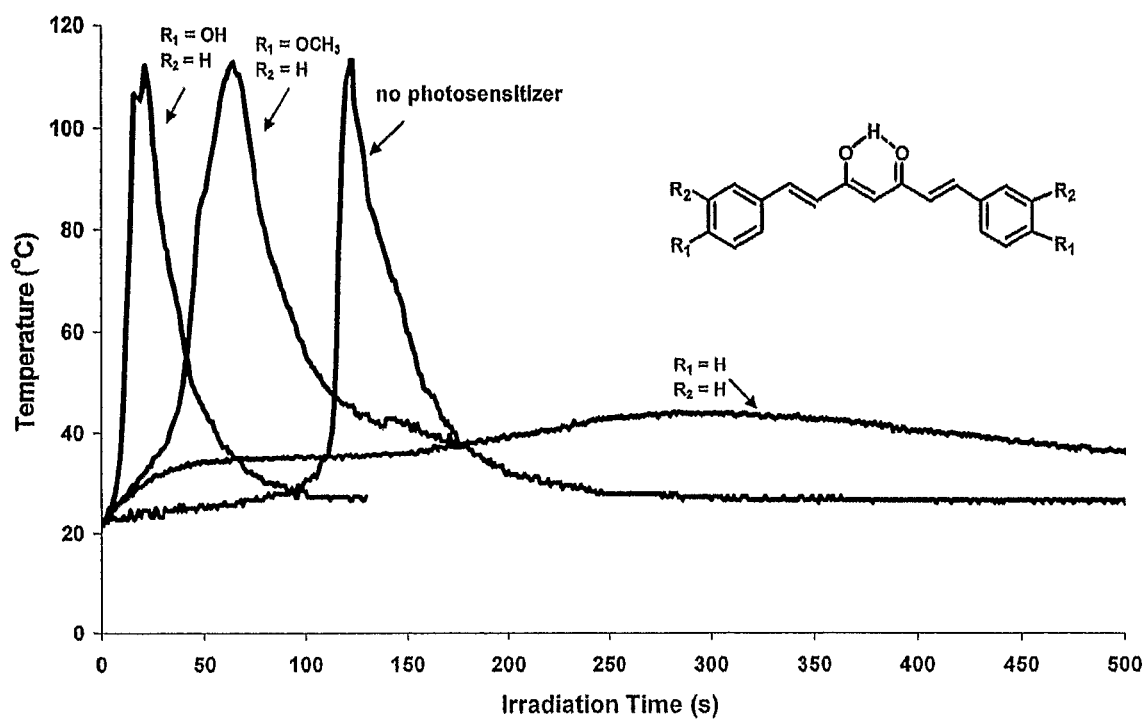
FIG. 13 depicts a plot of an OP comparison study of the photopolymerization of CHO, carried out in the presence and absence of various photosensitizers, in accordance with the present invention.

FIG. 13 depicts a plot of an OP comparison study of the photopolymerization of CHO, carried out in the presence and absence of various photosensitizers in accordance with the present invention. The photosensitizers (0.1 mol %) evaluated were 1,7-diphenyl-1,6-heptadiene-3,5-dione II; bis-dimethoxycurcumin III; and 1,7-bis(4-methoxyphenyl)-1,6-heptadiene-3,5-dione IV. The photoinitiator used in this study was IOC10 $SbF_6$ at a 1.0 mol %. An optical filter was used to give irradiation wavelengths from 355-460 nm with a midpoint 407 nm. The light intensity was 1530 $mJ/cm^2min$.

Referring to FIG. 13, photosensitizer II displays very poor photosensitization behavior and, compared to the control polymerization (no photosensitizer), appears to exhibit a retarding effect on the photopolymerization. This may be due to the poor UV absorption characteristics of II at the irradiating wavelengths. FIG. 13 also clearly shows that III is a more efficient photosensitizer than IV.

Example 14

Figure 14:
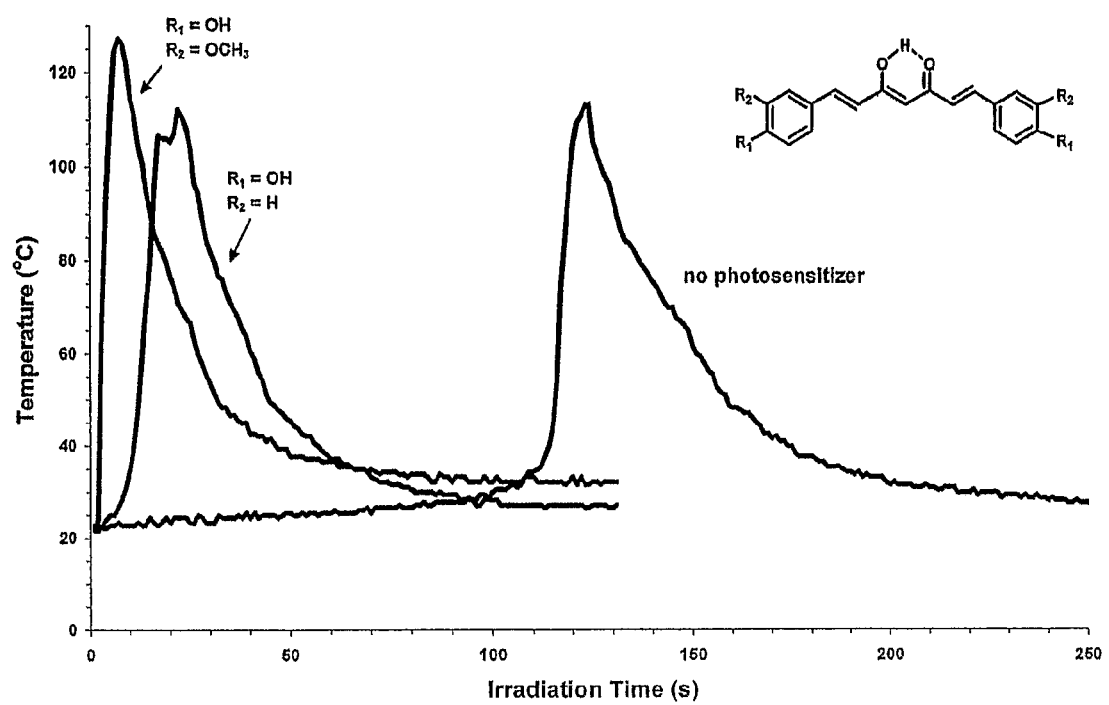
FIG. 14 depicts a plot of a second OP comparison study of the photopolymerization of CHO, carried out in the presence and absence of various photosensitizers, in accordance with the present invention.

FIG. 14 depicts a plot of a second OP comparison study of the photopolymerization of CHO, carried out in the presence and absence of various photosensitizers in accordance with the present invention. The photosensitizers (0.1 mol %) evaluated were curcumin I and bisdimethoxycurcumin III. The photoinitiator used in this study was IOC10 SbF$_6$ at a 1.0 mol %. An optical filter was used to give irradiation wavelengths from 355-460 nm with a midpoint 407 nm. The light intensity was 1530 mJ/cm$^2$min. Referring to FIG. 14, curcumin I is a better photosensitizer than bisdimethoxycurcumin III.

Example 15

Figure 15:
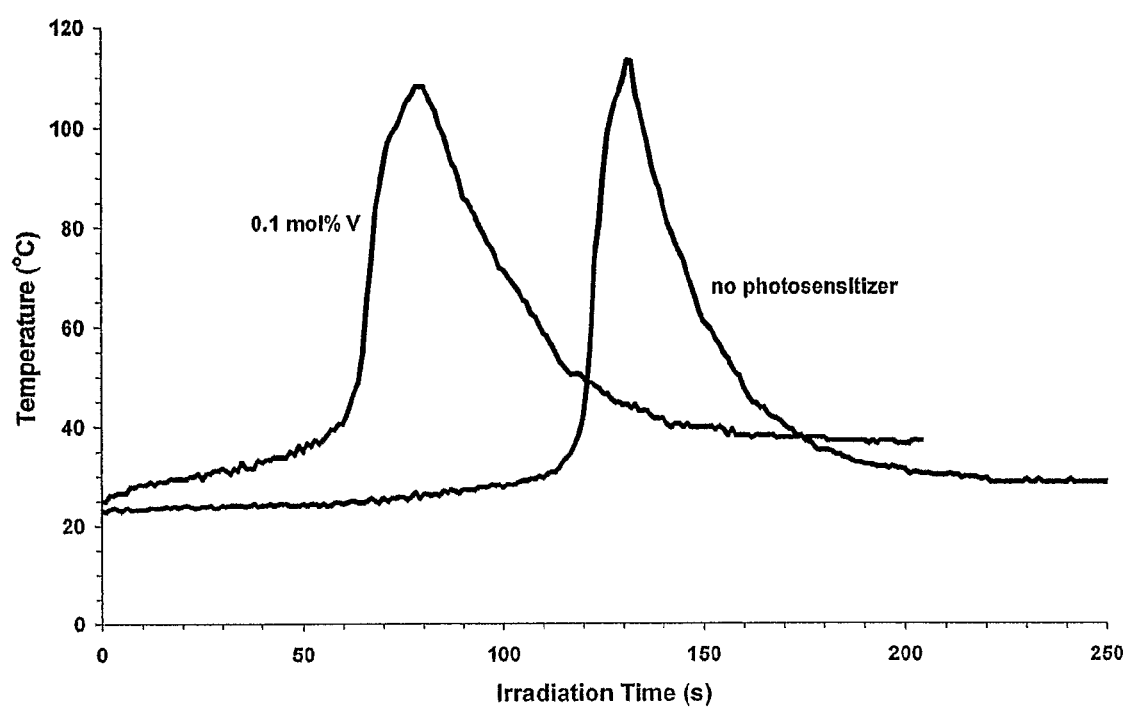
FIG. 15 depicts a plot of an OP study of the photopolymerization of CHO, carried out in the presence and absence of 1,11-Bis(phenyl)-1,3,8,10-undecatetraene-5,7-dione, in accordance with the present invention.

FIG. 15 depicts a plot of an OP study of the photopolymerization of CHO, carried out in the presence and absence of 1,11-bis(phenyl)-1,3,8,10-undecatetraene-5,7-dione (0.1 mol %) using an optical filter, in accordance with the present invention. The photoinitiator used in this study was IOC10 SbF$_6$ at a 1.0 mol %. Irradiation wavelengths were from 355-460 nm with a midpoint 407 nm. The light intensity was 1530 mJ/cm$^2$min. Referring to FIG. 15, V is an active photosensitizer for the diaryliodonium salt induced cationic ring-opening polymerization of CHO. It is anticipated that the introduction of additional stabilizing hydroxy or methoxy groups into the structure of V would further enhance its activity. An ink comprising a prepolymer mixture and a dye or pigment is presented in accordance with the present invention. The prepolymer mixture is as described previously in the present application. The prepolymer mixture comprises a catalyst component comprising a cationic photoinitiator, a photosensitizer component, and a monomer component. Examples of the dye or pigment include but are not limited to copper phthalocyanine, carbon black, dayglow pigments, iron oxide, zinc oxide, copper oxide, titanium dioxide, cadmium sulfide, and the like. The ink of the present invention may be applied to a substrate that includes but is not limited to a polymer material, a glass material, a wood material, a metal material, a textile material, a ceramic material, and combinations thereof.

A kit for applying and curing a coating is presented in accordance with the present invention. The kit comprises a prepolymer mixture and instructions for separately applying and curing the prepolymer mixture. The prepolymer mixture comprises (i) a catalyst component comprising from about 0.5 to about 5 parts by weight of a cationic photoinitiator; (ii) a photosensitizer component comprising from about 0.01 to about 10 parts by weight of curcumin or a curcuminoid; and (iii) a monomer component comprising from about 90 to about 99 parts by weight of a monomer chosen from oxetane monomers, epoxide monomers, and alkyl vinyl ether monomers.

In another embodiment of the present invention, the kit for applying and curing a coating may comprise (a) a prepolymer mixture comprising (i) a photosensitizer component comprising from about 0.01 to about 10 parts by weight of curcumin or a curcuminoid and (ii) a monomer component comprising from about 90 to about 99 parts by weight of a monomer chosen from oxetane monomers, epoxide monomers, and alkyl vinyl ether monomers, and (b) a catalyst mixture comprising from about 0.5 to about 5 parts by weight of a cationic photoinitiator.

A method for increasing the rate of polymerization of an oxetane, epoxide or alkyl vinyl ether in the presence of a cationic photoinitiator is presented in accordance with the present invention. The method comprises combining curcumin or a curcuminoid compound with oxetane, epoxide, alkyl vinyl ether or combination thereof and a cationic photoinitiator.

What is claimed is:

1. A prepolymer mixture comprising:
   a photosensitizer component comprising from about 0.01 to about 10 parts by weight of curcumin or a curcuminoid; and
   a monomer component comprising from about 90 to about 99 parts by weight of a monomer chosen from oxetane monomers, epoxide monomers, and alkyl vinyl ether monomers, said prepolymer mixture containing less than 1% of polymerizable functionalities including acrylate groups and ethylenic groups not directly bonded to an oxygen.

2. A prepolymer mixture according to claim 1, wherein said monomer is an epoxide monomer.

3. A prepolymer mixture according to claim 1, wherein said monomer is an oxetane.

4. A prepolymer mixture according to claim 1, wherein said monomer component includes an oxetane monomer selected from the group consisting of 3-ethyl-3-phenoxymethyloxetane, 3-methyl-3-phenoxymethyloxetane, 3-ethyl-3-[(2- ethylhexyloxy)methyl]oxetane, bis{[(1-ethyl(3-oxetanyl)]methyl}ether, 1,4-bis[(3-ethyl-3-oxetanylmethoxy)methyl]benzene, bis[(3-ethyl-3-oxetanylmethoxy)methyl] terephthalate, bis[(3-ethyl-3-oxetanylmethoxy)methyl] phenyl ether, 2-phenyloxetane, 3,3-bischloromethyloxetane 3,3-dimethyloxetane and 3,3-bisbromomethyloxetane.

5. A prepolymer mixture according to claim 1, wherein said monomer component includes an epoxide monomer selected from the group consisting of benzyl glycidyl ether, α,α-1,4-xylyldiglycidyl ether, bisphenol-A diglycidyl ether, ethyleneglycol diglycidyl ether, diethyleneglycol diglycidyl ether, neopentylglycol diglycidyl ether, 1,4-butanediol diglycidyl ether, 1,4-cyclohexanedimethanol diglycidyl ether, trimethylopropanetriol triglycidyl ether, glycerol triglycidyl ether, cresyl glycidyl ether, diglycidyl phthalate, cresol novolac epoxide, phenol novolac epoxide, bisphenol-A novolac epoxide, 3,4-epoxycyclohexylmethyl 3',4'-epoxycyclohexane, bis(3,4-epoxycyclohexylmethyl)adipate, 3,4-epoxycyclohexylmethyl 3',4'-epoxycyclohexane carboxylate, limonene dioxide, 1,2-epoxydecane, 1,2-epoxydodecane, 1,2-7,8-diepoxyoctane, epoxidized soybean oil, epoxidized linseed oil, epoxidized castor oil, epoxidized natural rubber, epoxidized poly(1,2- butadiene), epoxidized poly(1,4-butadiene), and epoxy functional silicone resins.

6. A prepolymer mixture according to claim 1, wherein said monomer component includes an alkyl vinyl ether monomer selected from the group consisting of 2-chloroethyl vinyl ether, triethylene glycol divinyl ether, cyclohexanedimethanol divinyl ether, and 1,4-butanediol divinyl ether.

7. A prepolymer mixture according to claim 1 additionally comprising a catalyst component comprising from about 0.5 to about 5 parts by weight of a cationic photoinitiator.

8. A method for coating a substrate comprising:
   applying a prepolymer mixture comprising: (i) a catalyst component comprising from about 0.5 to about 5 parts by weight of a cationic photoinitiator; (ii) a photosensitizer component comprising from about 0.01 to about 10 parts by weight of curcumin or a curcuminoid; and (iii) a monomer component comprising from about 90 to about 99 parts by weight of a monomer chosen from oxetane monomers, epoxide monomers, and alkyl vinyl ether monomers, said prepolymer mixture containing less than 1% of polymerizable functionalities including acrylate groups and ethylenic groups not directly bonded to an oxygen, to a substrate;

exposing said substrate and applied said prepolymer mixture to radiation.

9. The method of claim 8, wherein said substrate is a material selected from the group consisting of a polymer, a glass, a wood, a metal, a textile, a ceramic, and combinations thereof.

10. The method of claim 8, wherein said radiation is of a wavelength in a range from about 300 nm to about 500 nm.

11. A coated substrate manufactured by said method of claim 8.

12. An ink comprising:
a prepolymer mixture comprising: (i) a catalyst component comprising from about 0.5 to about 5 parts by weight of a cationic photoinitiator; (ii) a photosensitizer component comprising from about 0.01 to about 10 parts by weight of curcumin or a curcuminoid; and (iii) a monomer component comprising from about 90 to about 99 parts by weight of a monomer chosen from oxetane monomers, epoxide monomers, and alkyl vinyl ether monomers, said prepolymer mixture containing less than 1% of polymerizable functionalities including acrylate groups and ethylenic groups not directly bonded to an oxygen; and
a dye or a pigment.

13. The ink of claim 12, wherein said dye or said pigment is selected from the group consisting of copper phthalocyanine, carbon black, dayglow pigments, iron oxide, copper oxide, titanium dioxide, cadmium sulfide, and combinations thereof.

14. A kit for applying and curing a coating comprising:
(a) a prepolymer mixture which comprises
(i) a catalyst component comprising from about 1 to about 10 parts by weight of a cationic photoinitiator;
(ii) a photosensitizer component comprising from about 0.01 to about 10 parts by weight of curcumin or a curcuminoid; and
(iii) a monomer component comprising from about 90 to about 99 parts by weight of one or more of a monomer chosen from oxetane monomer, epoxide monomers; and alkyl vinyl ether monomers, said prepolymer mixture containing less than 1% of polymerizable functionalities including acrylate groups and ethylenic groups not directly bonded to an oxygen; and
(b) instructions for separately applying and curing said prepolymer mixture.

15. A method for increasing the rate of polymerization of an oxetane, epoxide or alkyl vinyl ether in the presence of a cationic photoinitiator said method comprising combining curcumin or a curcuminoid compound with said oxetane, epoxide, alkyl vinyl ether or combination thereof and a cationic photoinitiator.

16. A method according to claim 15 wherein said curcumin or curcuminoid compound is combined in an amount sufficient to increase the rate of polymerization by at least 10% at any wavelength between 250 nm and 500 nm.

17. A kit for applying and curing a coating comprising:
(a) a prepolymer mixture which comprises
(i) a photosensitizer component comprising from about 0.01 to about 10 parts by weight of curcumin or a curcuminoid; and
(ii) a monomer component comprising from about 90 to about 99 parts by weight of one or more of a monomer chosen from oxetane monomer, epoxide monomers; and alkyl vinyl ether monomers, said prepolymer mixture containing less than 1% of polymerizable functionalities including acrylate and ethylenic compounds, said prepolymer mixture containing less than 1% of polymerizable functionalities including acrylate groups and ethylenic groups not directly bonded to an oxygen; and
(b) a catalyst mixture comprising from about 0.5 to about 5 parts by weight of a cationic photoinitiator.

18. A prepolymer mixture according to claim 7, wherein said cationic photoinitiator is a diaryl-iodonium salt having counterions chosen from the group consisting of $BF_4^-$, $PF_6^-$, $AsF_6^-$, $SbF_6^-$, $GaF_6^-$, $TaF_6^-$, $B(C_6F_5)_4^-$, and $(C_6F_5SO_2)_2 CH^-$.

19. A prepolymer mixture according to claim 7, wherein said photosensitizer component includes a curcuminoid selected from the group consisting of:

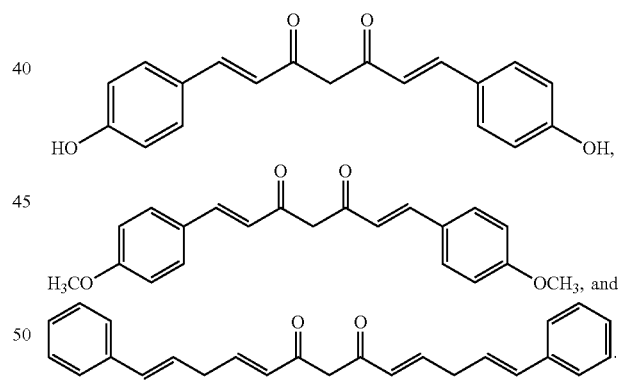

* * * * *